(12) United States Patent
Sunayama et al.

(10) Patent No.: US 7,955,970 B2
(45) Date of Patent: Jun. 7, 2011

(54) SEMICONDUCTOR DEVICE MANUFACTURING METHOD

(75) Inventors: Michie Sunayama, Kawasaki (JP); Noriyoshi Shimizu, Kawasaki (JP); Masaki Haneda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 194 days.

(21) Appl. No.: 12/500,186

(22) Filed: Jul. 9, 2009

(65) Prior Publication Data
US 2009/0269925 A1 Oct. 29, 2009

Related U.S. Application Data (63) Continuation of application No. PCT/JP2007/050074, filed on Jan. 9, 2007.

(51) Int. Cl.
*H01L 21/4763* (2006.01)
(52) U.S. Cl. ........ 438/638; 438/652; 438/654; 438/687; 257/E21.577
(58) Field of Classification Search .................. 438/674, 438/637, 638, 652, 654, 687; 257/E21.577
See application file for complete search history.

(56) References Cited

U.S. PATENT DOCUMENTS

| 6,123,825 | A | 9/2000 | Uzoh et al. | |
|---|---|---|---|---|
| 6,297,155 | B1 * | 10/2001 | Simpson et al. | 438/687 |
| 6,572,982 | B1 | 6/2003 | Uzoh et al. | |
| 6,709,970 | B1 * | 3/2004 | Park et al. | 438/620 |
| 7,479,700 | B2 * | 1/2009 | Takewaki et al. | 257/758 |
| 7,728,432 | B2 * | 6/2010 | Takewaki et al. | 257/751 |
| 2005/0112866 | A1 | 5/2005 | Takewaki | |
| 2005/0272258 | A1 | 12/2005 | Morita et al. | |
| 2006/0012046 | A1 | 1/2006 | Koura et al. | |
| 2007/0161242 | A1 | 7/2007 | Koura et al. | |
| 2008/0064202 | A1 | 3/2008 | Takewaki | |

FOREIGN PATENT DOCUMENTS

| JP | 2000174025 A | 6/2000 |
|---|---|---|
| JP | 2000353675 A | 12/2000 |
| JP | 2005158930 A | 6/2005 |
| JP | 2005223059 A | 8/2005 |
| JP | 2006019708 A | 1/2006 |
| JP | 2006032545 A | 2/2006 |
| JP | 2006294922 A | 10/2006 |

OTHER PUBLICATIONS

H. Shih et al., "Design of ECP Addititive for 65 nm-node Techonology Cu BEOL Reliability", IITC 2005.
G.B. Alers et al., "Influence of Copper Purity on Microstructure and Electromigration", IEEE 2004.
International Search Report issued in PCT/JP2007/050074 mailed on Mar. 6, 2007.
Notification of Transmittal of Translation of the International Preliminary Report on Patentability (Form PCT/IB/338) of International Application No. PCT/JP2007/050074 mailed Jul. 23, 2009 with Forms PCT/IB/373 and PCT/ISA/237.

* cited by examiner

*Primary Examiner* — Michael Trinh
(74) *Attorney, Agent, or Firm* — Westerman, Hattori, Daniels & Adrian, LLP (57) ABSTRACT

A process for producing a semiconductor device, comprising the wiring region forming step of forming a wiring region on a semiconductor substrate; the copper wiring layer forming step of forming a copper wiring layer on the formed wiring region by electrolytic plating technique, wherein the copper wiring layer is formed by passing a current of application pattern determined from the relationship between application pattern of current passed at electrolytic plating and impurity content characteristic in the formed copper wiring layer so that the impurity content in the formed copper wiring layer becomes desired one; and the wiring forming step of polishing the formed copper wiring layer into a wiring.

7 Claims, 14 Drawing Sheets

Fig. 4A (A) EMBEDDING OF WIDTH WIRING (Y/X>1)

Fig. 4B

Fig. 4C (C) FORMATION OF BULK COPPER

<IMPURITY CONTROL>
REPEAT LOW/HIGH CURRENTS

SEMICONDUCTOR DEVICE MANUFACTURING METHOD

CROSS-REFERENCE TO RELATED APPLICATIONS

This is a continuation of Application PCT/JP2007/050074, filed on Jan. 9, 2007, now pending, the contents of which are herein wholly incorporated by reference.

FIELD

The embodiments discussed herein are relates to a semiconductor device manufacturing method.

BACKGROUND

Over the recent years, a copper wiring has been adopted as a wiring material for Complementary Metal Oxide Semiconductor (CMOS) Large Scale Integration (LSI) in terms of reducing wiring resistance and enhancing durability against electromigration (EM) and stress migration (SM).

Copper (Cu) is, unlike aluminum (Al) which has hitherto been used, difficult of working the wiring by dry etching. Then, formation of the copper wiring generally involves adopting a damascene method of forming a trench serving as the wiring and a via serving as a contact in an insulating film and forming the wiring by embedding the copper therein, and a dual damascene method of forming the trench serving as the wiring and the via, and integrally forming the wiring and a plug by embedding the copper therein. An copper electroplating method is generally adopted in terms of productivity and costs on the occasion of growing the copper wiring layer.

The electroplated copper film (Cu electroplating deposition layer) based on the damascene method is mixed with impurities such as oxygen (O), carbon (C), sulfur (S), chlorine (Cl) and nitrogen (N), and it is known that impurities in the wiring affect the durability against the EM, the SIV, etc (refer to, e.g., Non-Patent documents 1 and 2).

In a copper wiring forming process based on a general Cu/Ta(N) wiring structure, the EM and the SIV are in a tradeoff-relationship. Namely, if the wiring has a narrow width, a problem is the durability against the EM but is solved by decreasing concentration of impurities. While on the other hand, if the wiring has the wide width, the problem is the durability against the SIV but is solved by increasing the concentration of impurities.

Accordingly, concentration of impurities is desired to be adjusted corresponding to the wiring width on the occasion of forming the copper wiring. Note that impurities in the copper plated film is thermally diffused by an annealing step after plating, and it is therefore preferable to make an adjustment of concentration of impurities, which includes this diffusion behavior.

Note that Patent document 1 discloses a technology for solving a decline of the EM durability due to a decrease in concentration of impurities that occurs when forming the copper wiring layer in a way that applies low power to the wafer at a first power level for a first time period; and positively pulsing a second power to the wafer during a second time period following the first time period, the second power having on time periods and off time periods, and solving occurrence of a void between the copper wiring layer and a seed layer, which is caused when forming the copper wiring layer by applying the low power. Namely, the technology discussed in Patent document 1 improves electric characteristics of the copper wiring layer by gaining a balance between the decrease quantity of concentration of impurities and the occurrence quantity of the void.

Further, Patent document 2 discloses a scheme of adjusting concentration of impurities of the plated copper by changing a magnitude of the electric current during the electroplating.

[Non-Patent document 1] Influence of Copper Purity on Microstructure and Electromigration. B. Alers, et al. (IEEE 2004)

[Non-Patent document 2] Design of ECP Additive for 65 nm-node Technology Cu BEOL Reliability, H. Shih, et al., (ITC 2005)

[Patent document 1] Japanese Patent Laid-Open Publication No. 2000-353675

[Patent document 2] Japanese Patent Laid-Open Publication No. 2006-32545

SUMMARY

A semiconductor device manufacturing method comprising: forming an inter-layer insulating film over a semiconductor substrate; forming a first wiring trench of which a depth-to-width ratio is larger than 1 and a second wiring trench of which the depth-to-width ratio is equal to or smaller than 1 in the inter-layer insulating film; forming a seed layer over the inter-layer insulating film, an internal wall of the first wiring trench and an internal wall of a second wiring trench; depositing a first copper layer over the seed layer up to a state where the first wiring trench is embedded but the second wiring group of trenches are not completely embedded by use of an electroplating method employing a current having a first current density; forming a second copper layer over the first copper layer till the second wiring group of trenches are embedded by use of the electroplating method of the current with a transition of the current density, which is conducted a plural number of times between the first current density and a second current density higher than the first current density; and polishing the seed layer, the first copper layer and the second copper layer formed over the inter-layer insulating film.

The object and advantage of the embodiment will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENTS

It is known that a difference of concentration of impurities of the copper electroplated film occurs depending on a composition of a plating liquid, a change of a plating condition, etc. A technology for improving the durability against the EM and the SIV by adjusting concentration of impurities of the electroplated copper film corresponding to a width etc of the wiring to be formed is not, however, established.

Such being the case, it is an object to provide a method of manufacturing a semiconductor device including a copper wiring layer of which concentration of impurities is adjusted.

One embodiment will hereinafter be described with reference to the drawings.

<Configuration>

Figure 1:
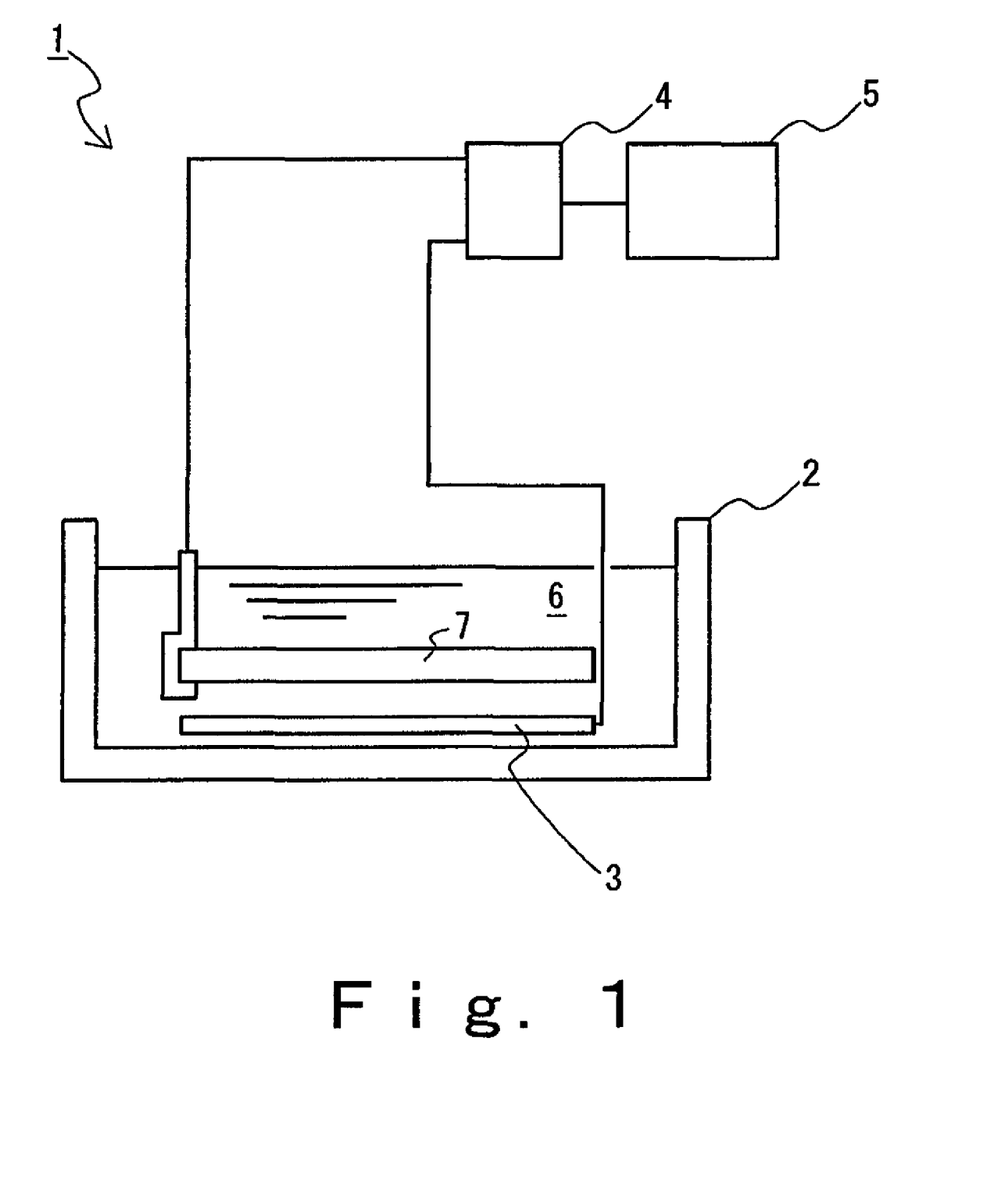
FIG. 1 is a view of an outline of a configuration of a semiconductor device manufacturing apparatus.

FIG. 1 is a diagram of an outline of a configuration of a semiconductor device manufacturing apparatus 1 according to the embodiment. The semiconductor device manufacturing apparatus 1 depicted in FIG. 1 is an copper electroplating apparatus for forming a copper wiring layer on a semiconductor substrate. As illustrated in FIG. 1, the semiconductor device manufacturing apparatus 1 includes a plating treatment tank 2, an electrode 3, a voltage applying unit 4 and a control unit 5.

The plating treatment tank 2 is constructed in a tank-like shape for retaining a plating liquid 6 and has a size enabling a semiconductor substrate 7 defined as a treatment target medium to be inputted. Note that the plating treatment tank 2 may be provided with an inlet and an outlet for replenishing or discharging the plating liquid 6. Further, an agitator for improving a scatter in distribution of concentration of impurities in the plating liquid 6, a rectifier for reducing disturbance of a flow of the plating liquid 6, etc may be disposed in an interior of the plating treatment tank 2.

The electrode 3 is, as depicted in FIG. 1, disposed in the interior of the plating treatment tank 2 and comes into contact with the plating liquid 6. The electrode 3 is electrically connected to the voltage applying unit 4.

The voltage applying unit 4 applies a potential difference of a DC component to between the semiconductor substrate 7 and the electrode 3. The voltage applying unit 4 is constructed to make variable the application voltage applied to between the semiconductor substrate 7 and the electrode 3 by changing a range of a variable resistor or switching over to a resistor having a different resistance value. This contrivance enables the plating current to be arbitrarily adjusted when plating the electroplated copper over the semiconductor substrate 7. Further, the voltage applying unit 4 is constructed to be capable of changing in a stepped shape the voltage applied to between the semiconductor substrate 7 and the electrode 3, generating spike-like waves in a pulse-like shape, or changing the waves in a ramp-like shape. A scheme of changing the application voltage in the step-like shape or spike-like shape can be realized by switching over the range of the resistor to a different range. Moreover, a scheme of changing the application voltage in the ramp-like shape can be actualized by gradually changing the range of the variable resistor.

The control unit 5 controls the voltage applying unit 4. The control unit 5 changes the application voltage which is output from the voltage applying unit 4, corresponding to a thickness of the copper wiring layer in the grown film and a width of the wiring area. A pattern (a wavelength, an amplitude and a waveform) of the application voltage, which is output by the voltage applying unit 4, may be generated in a way that counts pulses generated by a crystal oscillator and changes the application voltage in the stepped shape when the pulse count reaches a desired count value, and may also be generated in a way that predetermines the application voltage patterns to be generated corresponding to the thickness etc of the wiring layer and organizing these items of data into a map, wherein the application voltage pattern may be generated based on this map. Note that the thickness of the copper wiring layer in the grown film can be acquired by calculating the thickness from an integrated value of the currents and a surface area of the semiconductor substrate.

<Processing Flow>

Figure 2A:
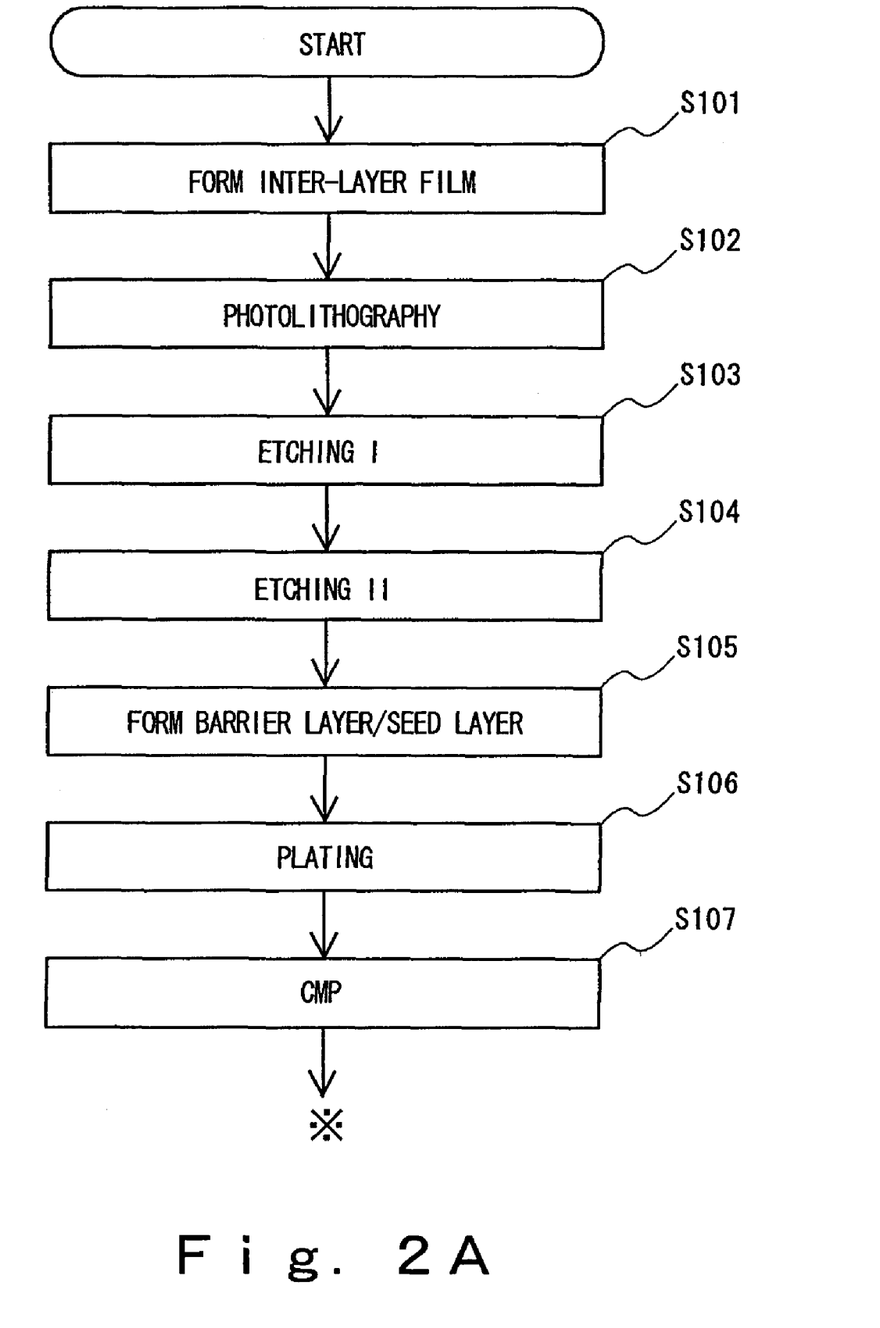
FIG. 2A is a flowchart illustrating a processing flow of a semiconductor device manufacturing method.
Figure 2B:
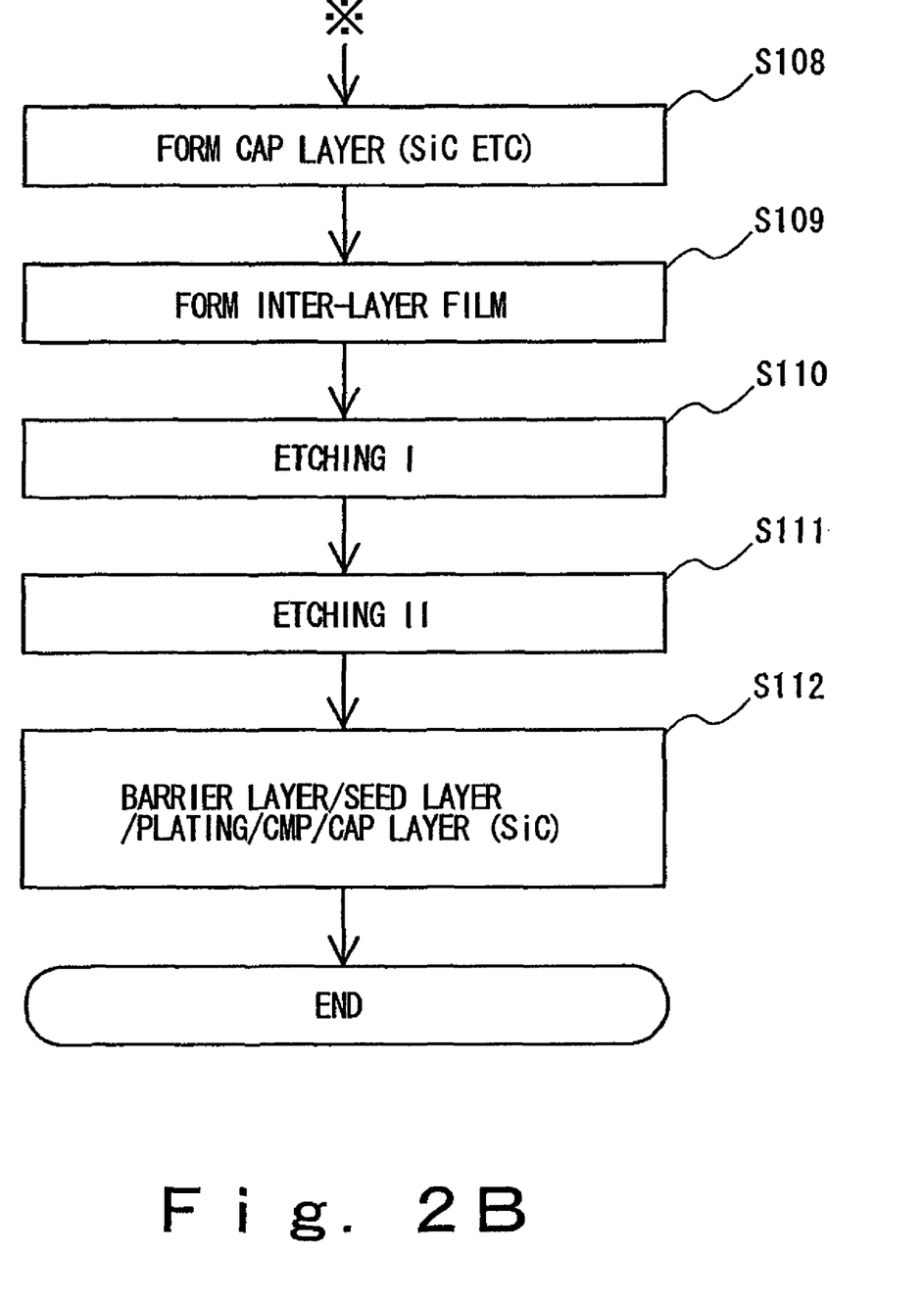
FIG. 2B is a flowchart illustrating the processing flow of the semiconductor device manufacturing method.

Next, a (processing) flow of a semiconductor device manufacturing method according to the embodiment will be discussed. FIGS. 2A-2B are flowcharts each illustrating the processing flow of the semiconductor device manufacturing method according to the embodiment. Further, FIGS. 3A-3L are views each depicting a section of the semiconductor substrate 7 in each of manufacturing steps when manufactured by the semiconductor device manufacturing method according to the embodiment. The semiconductor device manufacturing method according to the embodiment will hereinafter be described with reference to the flowcharts in FIGS. 2A-2B and the sectional views in FIGS. 3A-3L.

Figure 3A:
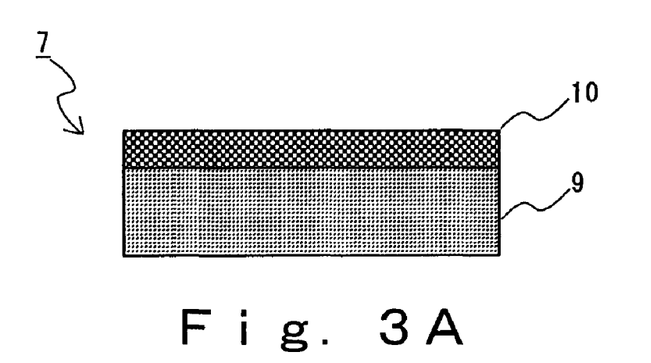
FIG. 3A is a diagram depicting a section of the semiconductor substrate.

(Step S101) To start with, an inter-layer insulating film is formed on the semiconductor substrate 7. Then, a first silicon oxide film 9 and a first silicon nitride film 10 are grown on the inter-layer insulating film. FIG. 3A depicts a section of the semiconductor substrate 7 in a state where the first silicon oxide film 9 and the first silicon nitride film 10 are grown on the inter-layer insulating film.

Figure 3B:
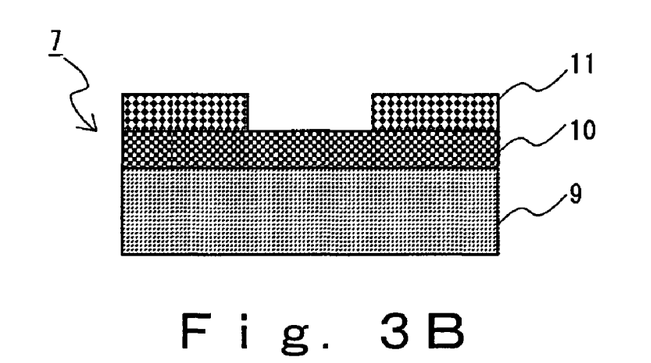
FIG. 3B is a diagram depicting a section of the semiconductor substrate.

(Step S102) Next, a photo resist film 11 is coated over the first silicon nitride film 10, patterning of wiring is effected over the photo resist film 11. FIG. 3B illustrates a section of the semiconductor substrate 7 in a state where the photo resist film 11 is subjected to the patterning of the wiring.

Figure 3C:
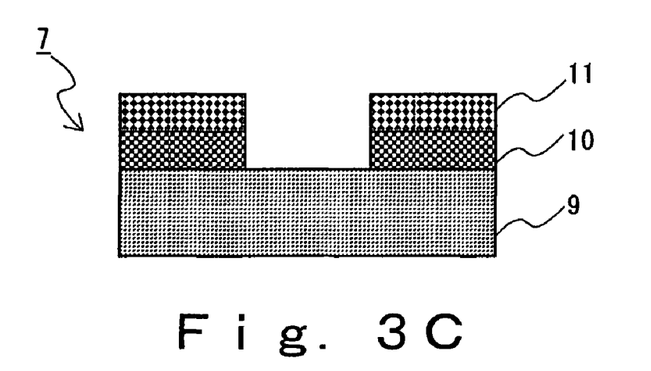
FIG. 3C is a diagram depicting a section of the semiconductor substrate.

(Step S103) Subsequently, the first silicon nitride film 10 undergoes the patterning of the wiring. The patterning of the wiring of the first silicon nitride film 10 is conducted by a photolithography method with the photo resist film 11 serving as a mask. FIG. 3C depicts a section of the semiconductor substrate 7 in a state where the first silicon nitride film 10 is subjected to the patterning of the wiring.

Figure 3D:
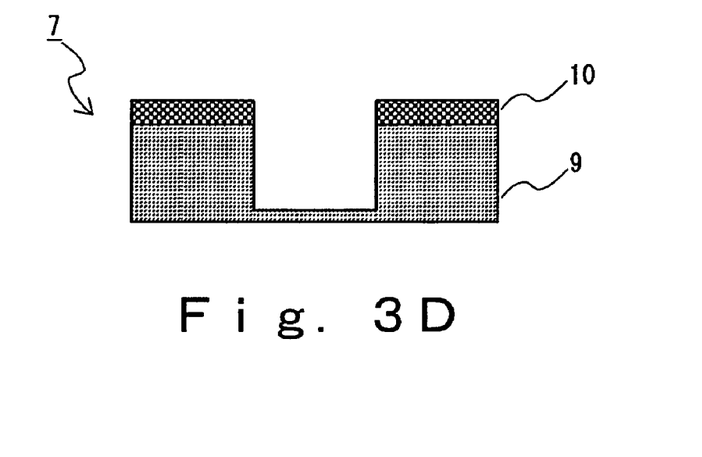
FIG. 3D is a diagram depicting a section of the semiconductor substrate.

(Step S104) Next, the first silicon oxide film undergoes the patterning of the wiring. The patterning of the wiring of the first silicon oxide film 9 is performed by the photolithography method with the photo resist film 11 serving as a mask. Then, the semiconductor substrate 7 is dissolved in an acid solution and thus rinsed, thereby removing the photo resist film 11. FIG. 3D illustrates a section of the semiconductor substrate 7 in a state where the first silicon oxide film 9 is subjected to the patterning of the wiring. As depicted in FIG. 3D, a first wiring trench 12 is formed in the first silicon oxide film 9 and in the first silicon nitride film 10 through a process in S101 to S104.

Figure 3E:
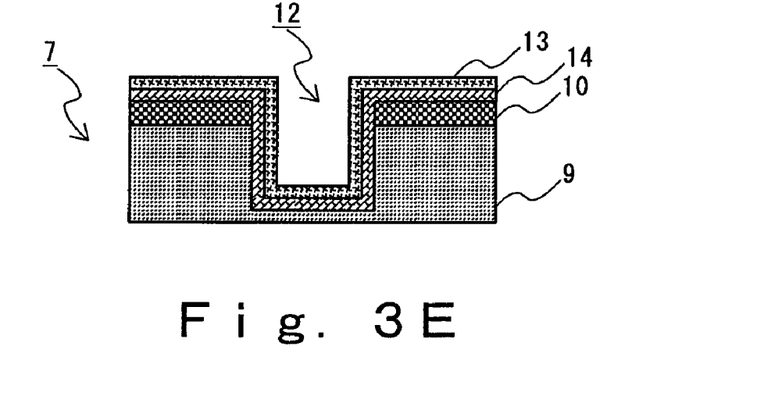
FIG. 3E is a diagram depicting a section of the semiconductor substrate.

(Step S105) Subsequently, a first barrier metal layer 14 and a first seed layer 13 defined as a seed layer for copper plating are grown on the first silicon nitride film 10 as we as within the first wiring trench 12. FIG. 3E depicts a section of the semiconductor substrate 7 formed with the first barrier metal layer 14 and the first seed layer 13.

Figure 3F:
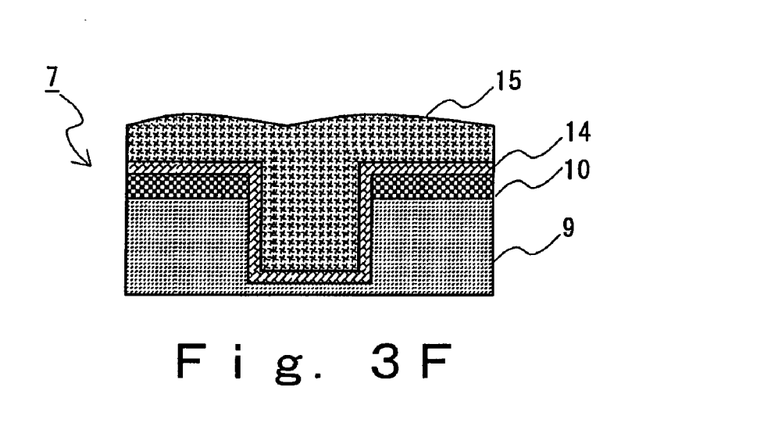
FIG. 3F is a diagram depicting a section of the semiconductor substrate.

(Step S106) Next, the copper electroplating is carried out with the first seed layer 13 serving as a seed, whereby a first copper layer 15 is grown on the first barrier metal layer 14. The first copper layer 15 undergoes the copper electroplating and is thus formed by using the semiconductor device manufacturing apparatus 1 described above. FIG. 3F illustrates a section of the semiconductor substrate 7 formed with the first copper layer 15.

Note that FIGS. 4A-4D are diagrams each illustrating a forming method on the occasion of forming an electroplated copper film (Cu electroplating deposition layer) in the first wiring trench 12. The electroplated copper film is formed in the first wiring trench 12 as below.

To begin with, a plating liquid 6 is poured into the semiconductor device manufacturing apparatus 1. The plating liquid 6 used when forming the first copper layer 15 involves employing a liquid containing a predetermined quantity of a copper ion, a chloride ion, an accelerator serving as an additive, a suppressor, a leveler, etc. In the embodiment, ViaForm (registered trademark) Low Acid is used as the plating liquid 6. Incidentally, ViaForm® NExT™ plating solution of Enthone Inc. may also be available.

Figure 3G:
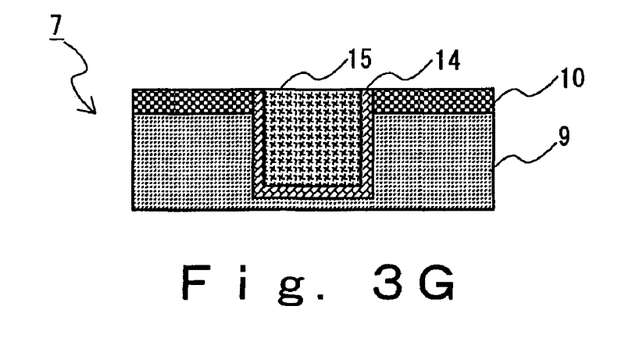
FIG. 3G is a diagram depicting a section of the semiconductor substrate.
Figure 3H:
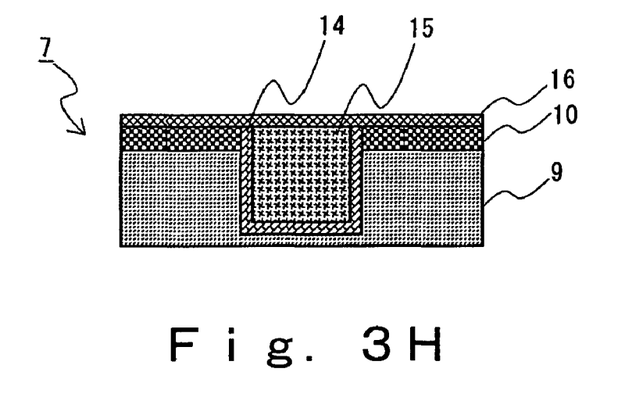
FIG. 3H is a diagram depicting a section of the semiconductor substrate.
Figure 3I:
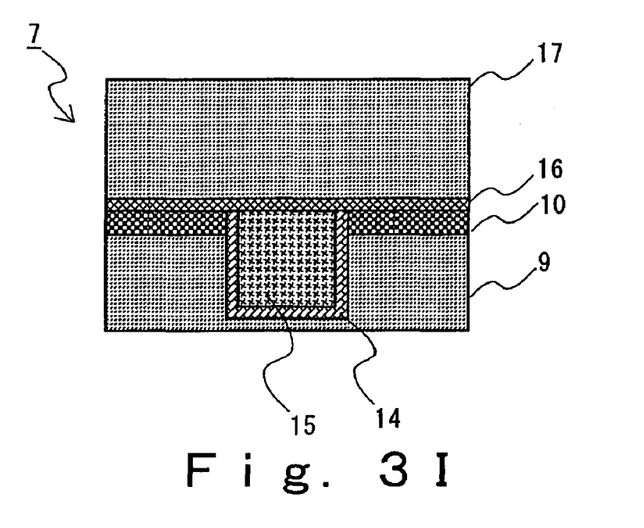
FIG. 3I is a diagram depicting a section of the semiconductor substrate.
Figure 3J:
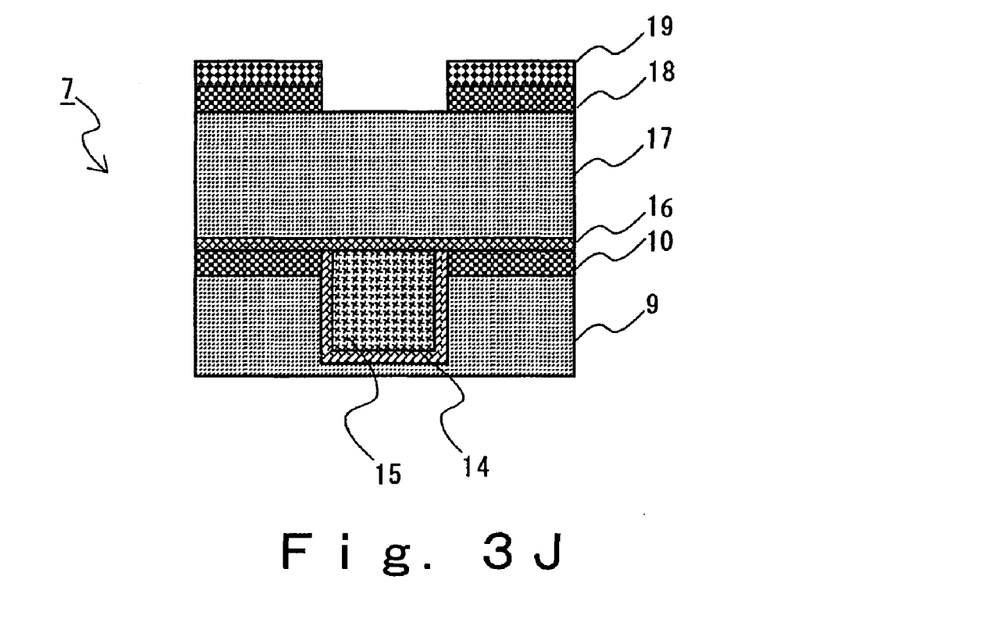
FIG. 3J is a diagram depicting a section of the semiconductor substrate.
Figure 3K:
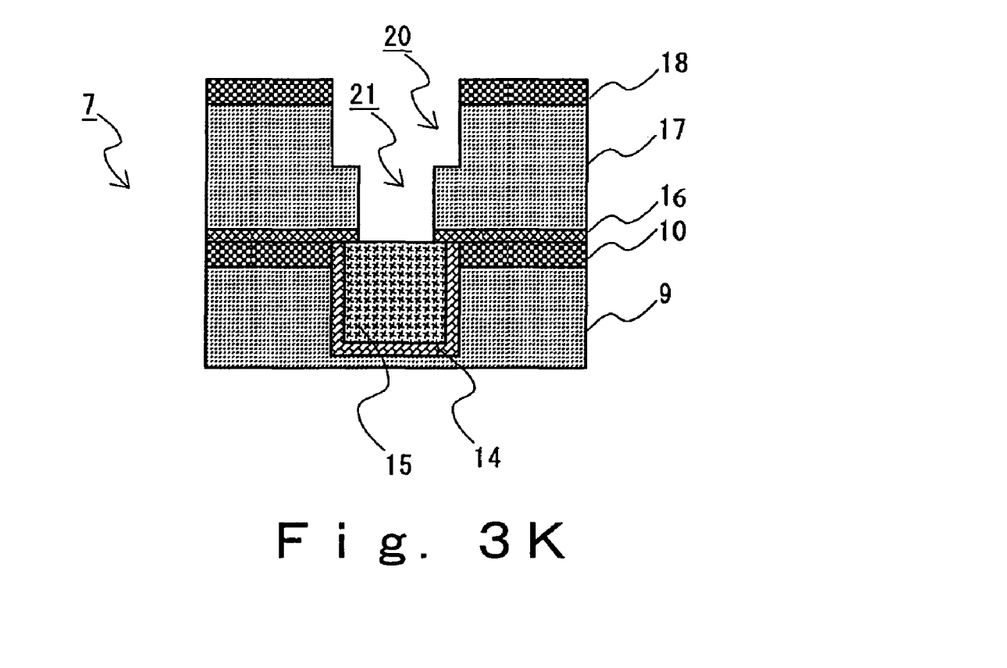
FIG. 3K is a diagram depicting a section of the semiconductor substrate.
Figure 3L:
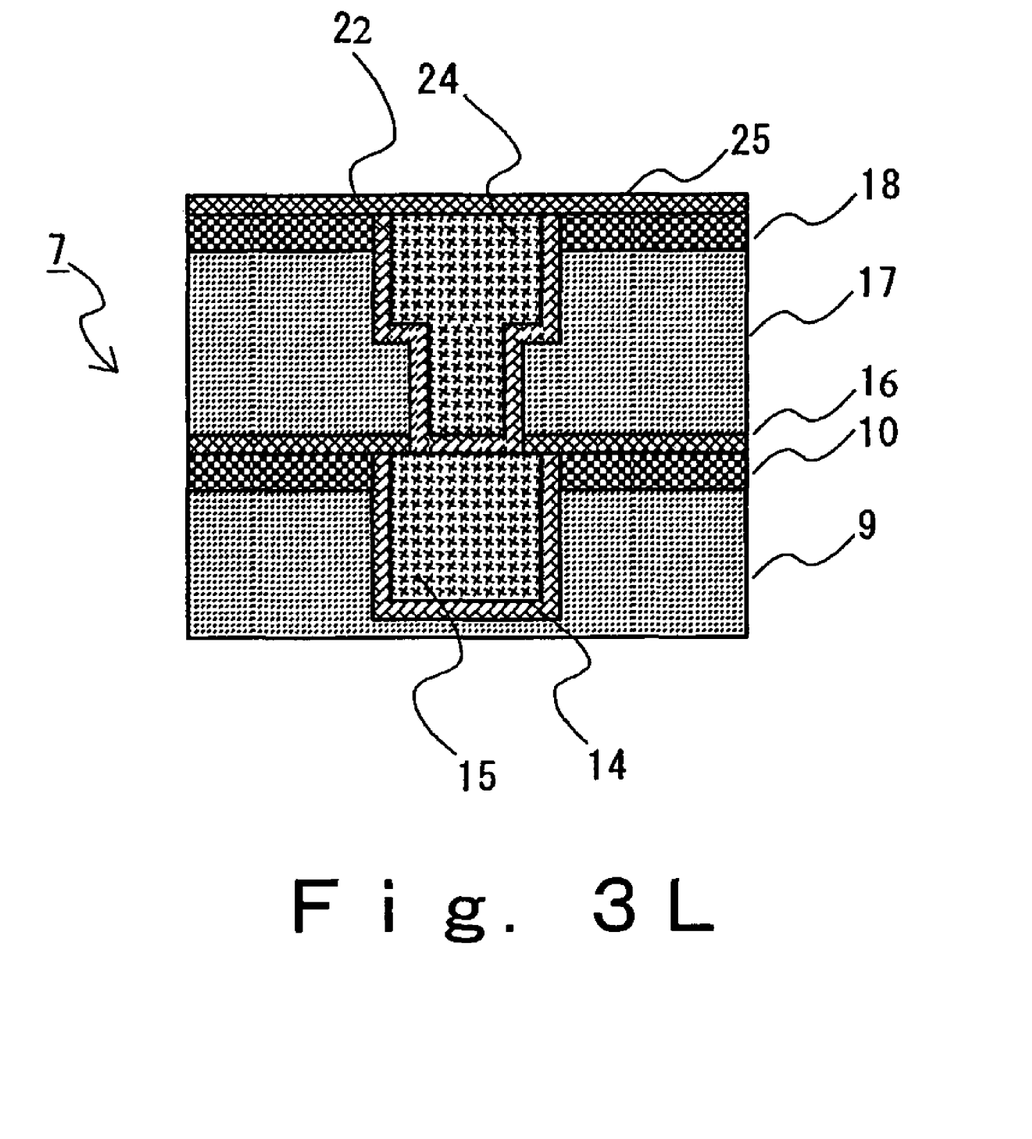
FIG. 3L is a diagram depicting a section of the semiconductor substrate.
Figure 4A:
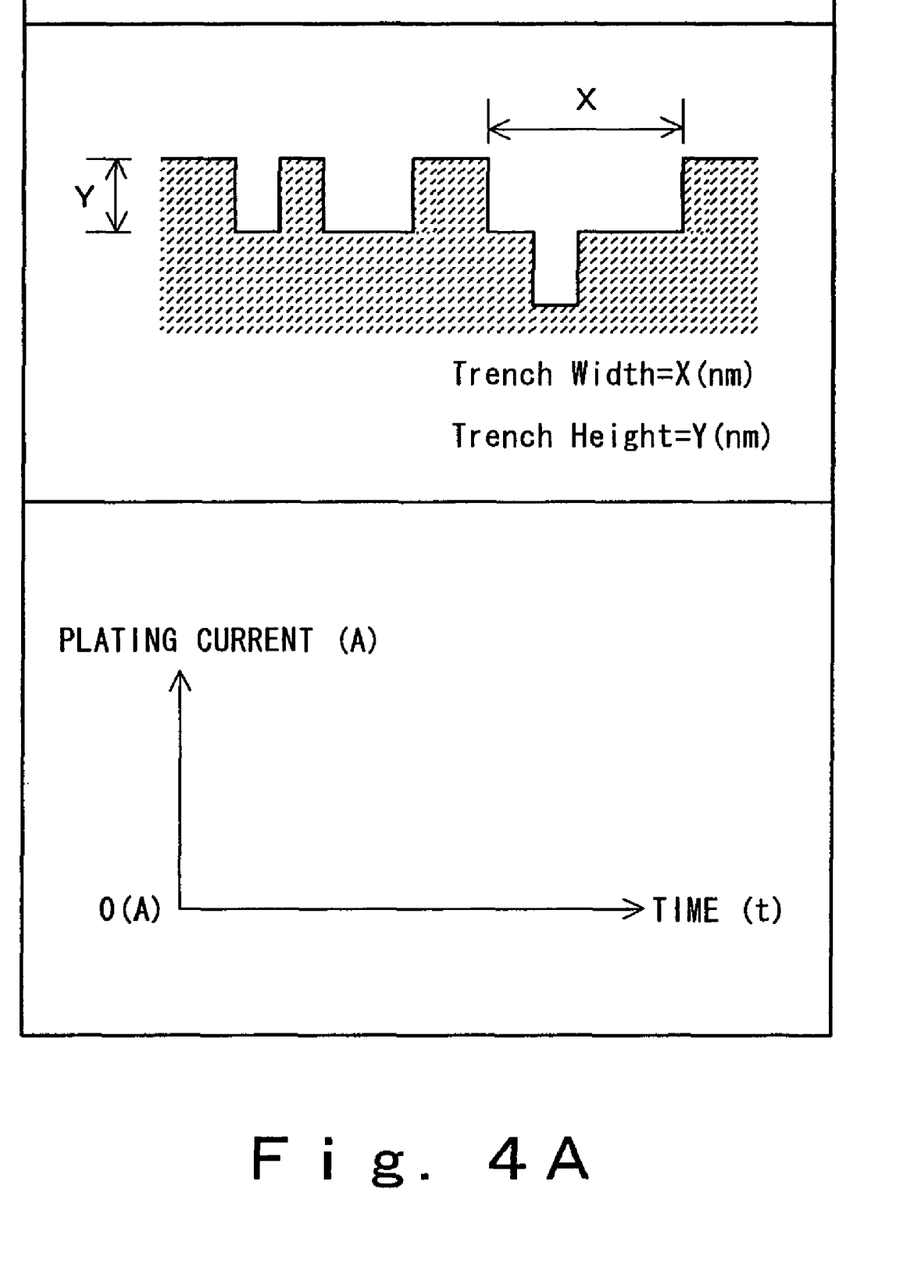
FIG. 4A is a diagram illustrating a forming method when forming an electroplated copper film.
Figure 4B:
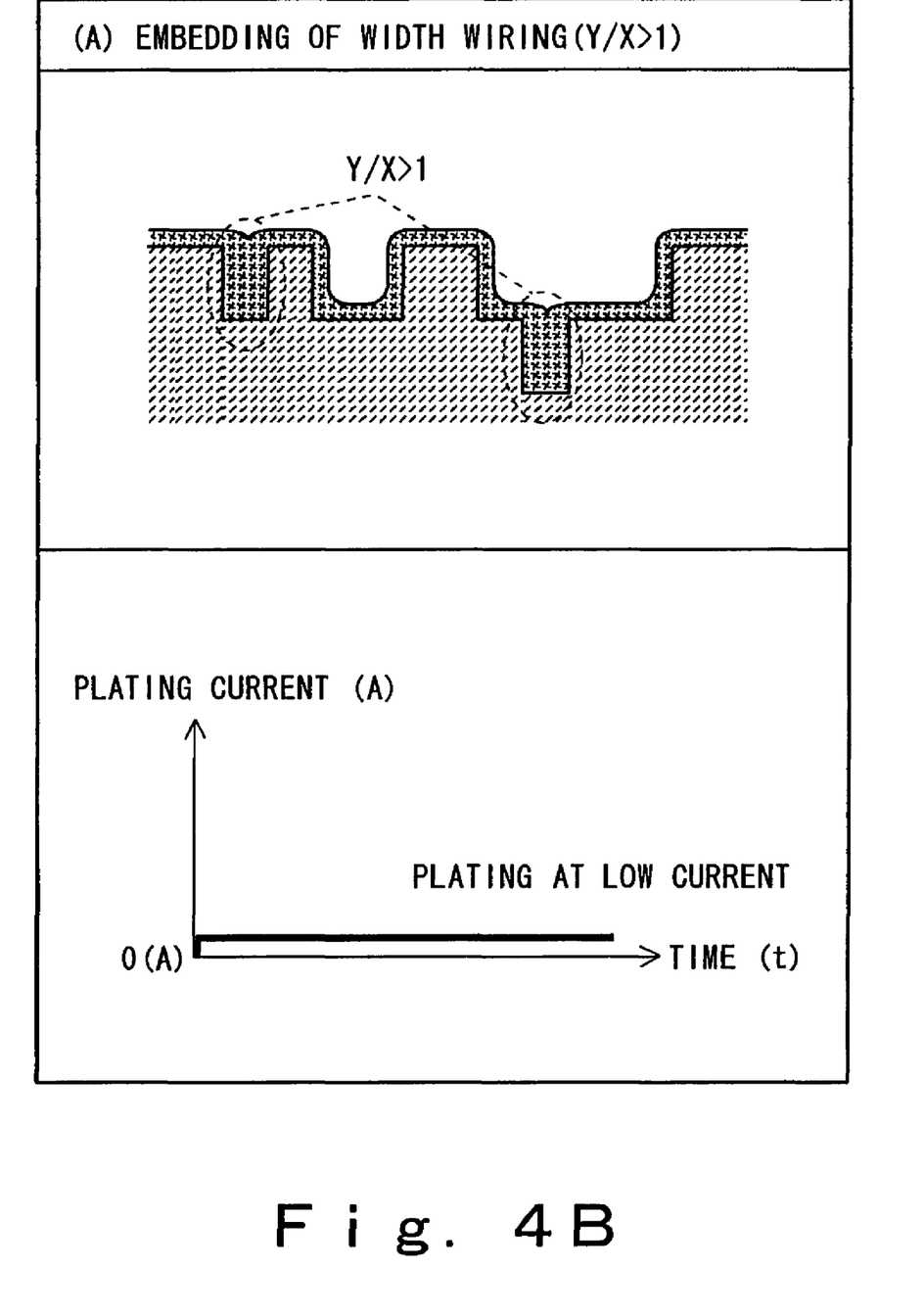
FIG. 4B is a diagram illustrating the forming method when forming the electroplated copper film.
Figure 4C:
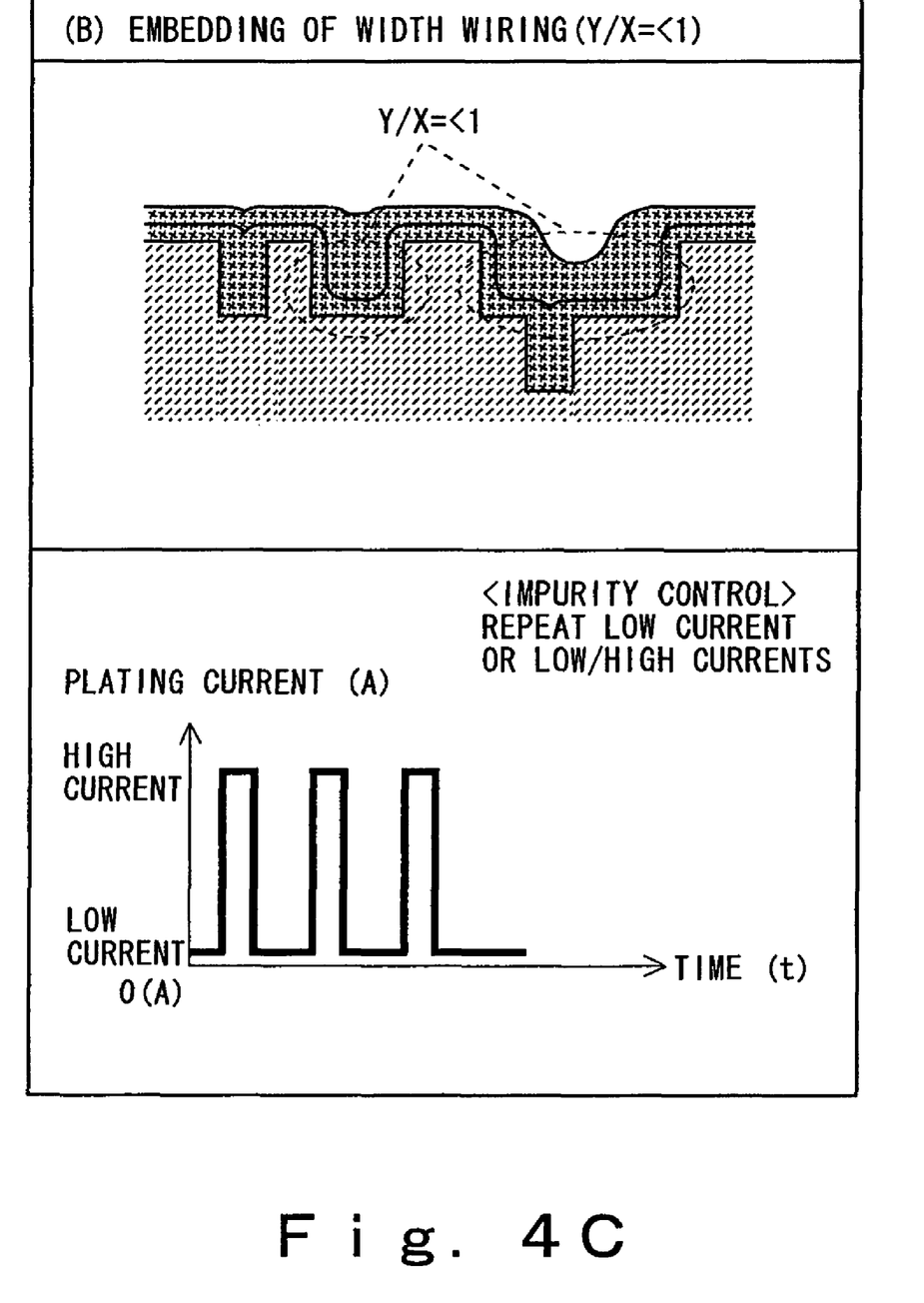
FIG. 4C is a diagram illustrating the forming method when forming the electroplated copper film.

At first, the semiconductor substrate 7 is dipped in the plating liquid 6 within the plating treatment tank 2. Herein, the first wiring trench 12 provides the wiring in which a ratio of a wiring height to a wiring width is equal to or smaller than 1. As a matter of fact, the wirings having a variety of line widths exist within the semiconductor substrate 7, however, the illustrations in FIGS. 3A-3L emphasize the wirings each having the wide width. The control unit 5, on the occasion of forming the electroplated copper film in the first wiring trench 12, controls the voltage applying unit 4 so as to flow the current having an application pattern as depicted in FIG. 4C. The current having the application pattern as depicted in FIG. 4C is previously prepared as a map corresponding to the wiring width, and it is preferable that concentration of impurities contained in the copper plating to be formed comes to predetermined concentration. A map representing a relationship between the application pattern of the current, concentration of impurities and the wiring width is generated through an experiment etc beforehand.

To be specific, when plating the first wiring trench 12 with the copper, a low current and a high current alternately flow to the plating target portion by changing the plating voltage. Generally, it is known that concentration of impurities of the copper plating rises during a period for which the plating current changes (i.e., a transition period for which the current transitions to the high current from the low current, or alternatively a transition period for which the current transitions to the low current from the high current). Such being the case, on the occasion of forming the copper plated film in the first wiring trench 12 for forming the wiring having the wide width, concentration of impurities of the electroplated copper film formed in the first wiring trench 12 can be set higher than concentration of impurities when the film is grown at the fixed current by performing the copper electroplating at the current with such an application pattern that the low current and the high current flow alternately. With this contrivance, the wide-width wiring having high durability against the SIV (Stress-Induced Voiding) is formed.

Herein, it is preferable that a thickness of the copper plated film formed in the low-current state is equal to or smaller than one-fourth of a thickness of the copper plated film formed in the high-current state. A plating film-growth speed is slow in the low-current condition, and hence impurities (at least any-one of sulfur, chlorine, oxygen, carbon and nitrogen) having the proper concentration can be mixed in the copper plated film to be formed without any substantial decrease in treatment speed (the total throughput) by use of this film thickness ratio. Note that the thickness of the copper plated film formed in the low-current state is, it is desirable, equal to or smaller than one-fourth, more preferably, one-tenth of the thickness of the thickness of the copper plated film formed in the high-current state. With this contrivance, it is feasible to mix impurities of which the concentration is proper to the copper plated film to be formed.

Note that a scheme in the case of desiring to increase concentration of impurities of the electroplated copper film is to increase a current difference between the low-current state and the high-current state, and to increase a ratio of the film growth time in the low-current state to a total of the film growth time in the high-current state and the film growth time in the low-current state. Conversely, a scheme in the case of desiring to decrease concentration of impurities of the electroplated copper film is to reduce the current difference between the low-current state and the high-current state, and to decrease the ratio of the film growth time in the low-current state to the total of the film growth time in the high-current state and the film growth time in the low-current state. Concentration of impurities can be arbitrarily adjusted by thus changing the current application pattern in a way that adjusts the voltage.

Note that the current application pattern depicted in FIG. 4C is that the spike-shaped wave form takes the pulsating configuration, however, another available scheme is that three or more levels of current states are set, and the current application pattern takes waveforms which changes stepwise (on a step-by-step basis). Further, the first wiring trench 12 may be formed with the electroplated copper film at the fixed low current, however, in this case the plating time is elongated.

Note that either a hot entry (a method which starts dipping in a state where the voltage applying unit 4 applies the voltage) or a cold entry (a method by which the voltage applying unit 4 applies the voltage after being dipped) may be available on the occasion of dipping semiconductor substrate 7 into the plating liquid 6. Moreover, other available methods are a ramped entry (a method of dipping while changing the application voltage in a ramp shape), a potentiostatic entry (a method of dipping so that the application voltage changes in proportion to a dipping area of a wafer) and a triggered entry (a method which starts dipping in a state of applying a low application voltage and applying a high application voltage upon completion of dipping).

Figure 4D:
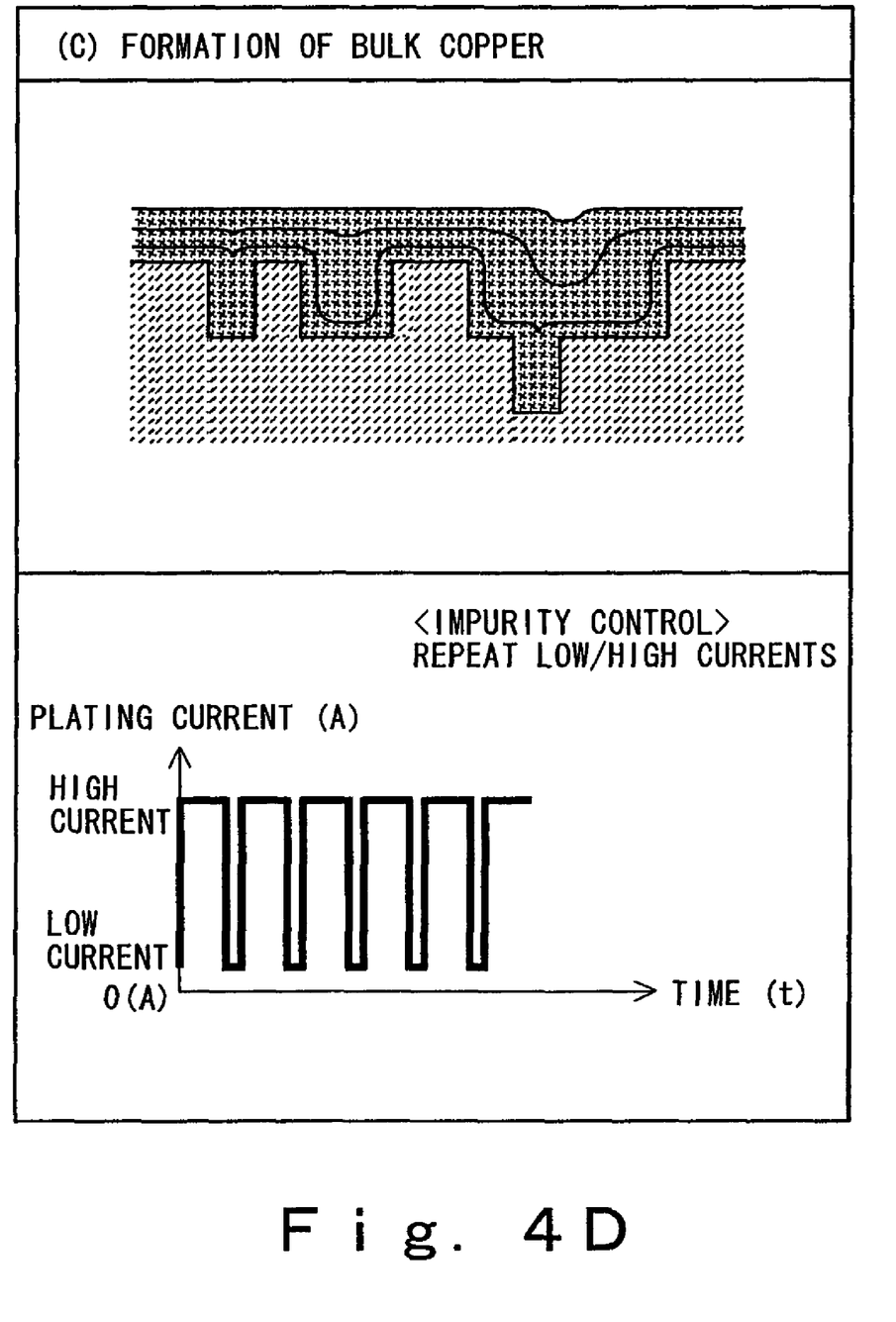
FIG. 4D is a diagram illustrating the forming method when forming the electroplated copper film.

The control unit 5 controls the voltage applying unit 4 after completion of forming the electroplated copper film in the first wiring trench 12, and changes the current application pattern to, e.g., a waveform as depicted in FIG. 4D. Namely, the bulk copper having the high concentration of impurities (which is, i.e., the electroplated copper film in a portion on the first wiring trench 12 and on the first barrier metal layer 14) is formed through the frequent transitions between the high-current state and the low-current state. Then, after forming the bulk copper having the high concentration of impurities, an annealing treatment is executed as the necessity may arise. Impurities within the bulk copper can be diffused into the copper plating within the first wiring trench 12 by executing the annealing treatment. Note that when executing the annealing treatment at 250° C. or higher, impurities within the bulk copper is diffused more preferably into the copper plating within the first wiring trench 12. If the annealing temperature after plating is equal to or lower than 250° C., impurities diffusing speed is low, and therefore it follows that the in-wiring impurities taken in by plating stays as it is within the wiring even after annealing. Accordingly, with respect to the current waveform controlled when forming the bulk copper, the plating treatment is conducted at the low current as hitherto done, and impurities of the bulk copper may be small. Thus, the current waveform controlled when forming the bulk copper can be changed corresponding to the annealing temperature after plating.

Incidentally, herein, the low-current state connotes a state in which the current flows between the semiconductor substrate 7 and the plating liquid with a current density per unit area that is arbitrarily determined by a user etc and is on the order of 10 mA/cm$^2$ or under. Further, the high-current state connotes a state in which the current flows between the semiconductor substrate 7 and the plating liquid with the current density per unit area that is higher than the current density, in the low-current state, arbitrarily determined by the user etc and is on the order of 10 mA/cm$^2$ or above.

Herein, if the current density in the high-current state is equal to or larger than three times, more preferably, five times the current density in the low-current state, concentration of impurities can be enriched more effectively.

(Step S107) Next, the formed first copper layer 15 and the formed first barrier metal layer 14 are polished by a CMP (Chemical Mechanical Polishing) method, with the result that the first copper layer 15 remains only within the first wiring trench 12. With this contrivance, the first copper layer 15 is formed in the wiring pattern. FIG. 3G illustrates a section of the semiconductor substrate 7 in which after being polished by the CMP method, the first copper layer 15 is formed in the wiring pattern.

(Step S108) Subsequently, a first cap layer 16 (composed of SiC etc) is grown on the first copper layer 15 and the first silicon nitride film 10. FIG. 3H depicts a section of the semiconductor substrate 7 formed with the first cap layer 16. The first cap layer 16 is grown on the first copper layer 15, thereby restraining the diffusion of impurities within the first copper layer 15 at the copper interface.

(Step S109) Next, a second silicon oxide film 17 is grown on the first cap layer 16. FIG. 3I depicts a section of the semiconductor substrate 7 formed with the second silicon oxide film 17.

(Step S110) Subsequently, a second silicon nitride film 18 is grown on the second silicon oxide film 17, a photo resist film 19 is coated, and the second silicon nitride film 18 is subjected to the patterning of the wiring in a way that uses the photo resist film 19 undergoing the patterning of the wiring as a mask. FIG. 3J illustrates a section of the semiconductor substrate 7 in a state where the second silicon nitride film 18 is subjected to the patterning of the wiring.

(Step S111) Next, the second silicon oxide film 17 undergoes the patterning of the wiring and is formed with a via. FIG. 3K depicts a section of the semiconductor substrate 7 in a state where the second silicon oxide film 17 is formed with a second wiring trench 20 and a via 21. As illustrated in FIG. 3K, a bottom portion of the via 21 reaches an upper surface of the first copper layer 15, and a part of the first copper layer 15 is exposed on the side of the upper surface of the semiconductor substrate 7.

(Step S112) Subsequently, a second barrier metal layer 22 and a second seed layer defined as a copper plating seed are formed on the second silicon nitride film 18 as well as within the second wiring trench 20. Then, the copper electroplating is carried out with the formed second seed layer serving as a seed, and a second copper layer 24 is formed on the second barrier metal layer 22. Subsequently, the second copper layer 24 and the second barrier metal layer 22 are polished by the CMP method, with the result that the second copper layer remains only within the second wiring trench 20. With this configuration, the second copper layer 24 is formed in the wiring pattern. Then, a second cap layer 25 is grown on the second copper layer 24 and on the second silicon nitride film 18. FIG. 3L depicts a section of the semiconductor substrate 7 formed with the first copper layer 15.

Note that on the occasion of forming the electroplated copper film in the second wiring trench 20, the semiconductor substrate 7 is dipped in the plating liquid 6 within the plating treatment tank 2 by the hot entry method etc in the same way as when plating the interior of the first wiring trench 12 with the copper.

Then, the control unit 5 controls the voltage applying unit 4, thus forming the electroplated copper film. Note that in the second wiring trench 20, a region formed with the wide-width wiring and a region formed with the narrow-width wiring coexist on the same plane. Further, there also exists a via connecting with the wiring layer 15 as the first layer. Hence, at first, the control unit 5, on the occasion of the forming the electroplated copper film in the narrow-width wiring region and the via region on the lower side, as illustrated in FIG. 4B (the via region is not shown in FIGs), applies the plating voltage so that the fixed low current flows. With this contrivance, at first, the copper plated film is formed in the narrow-width wiring region and the via. With the formation thereof, the narrow-width wiring exhibiting the high durability against the EM is formed. After the narrow-width wiring region and the via have been embedded with the copper as described above, successively the electroplated copper film is formed by the current taking the application pattern illustrated in FIG. 4C on the wide-width wiring region of the second wiring trench 20 and on the second barrier metal layer 22, however, the forming method thereof is the same as in the case of the first wiring trench 12 described above, and therefore its description is omitted.

Through a series of processes in step S101 to step S112, the wring with concentration of impurities adjusted corresponding to the width of the wiring is formed, and it is feasible to manufacture the semiconductor device having the high durability against the SIV and the EM.

Note that the multi-layered wiring of the first copper layer 15 and the second copper layer 24 is formed, however, the mono-layered wiring may also be available.

<Effects>

Figure 5A:
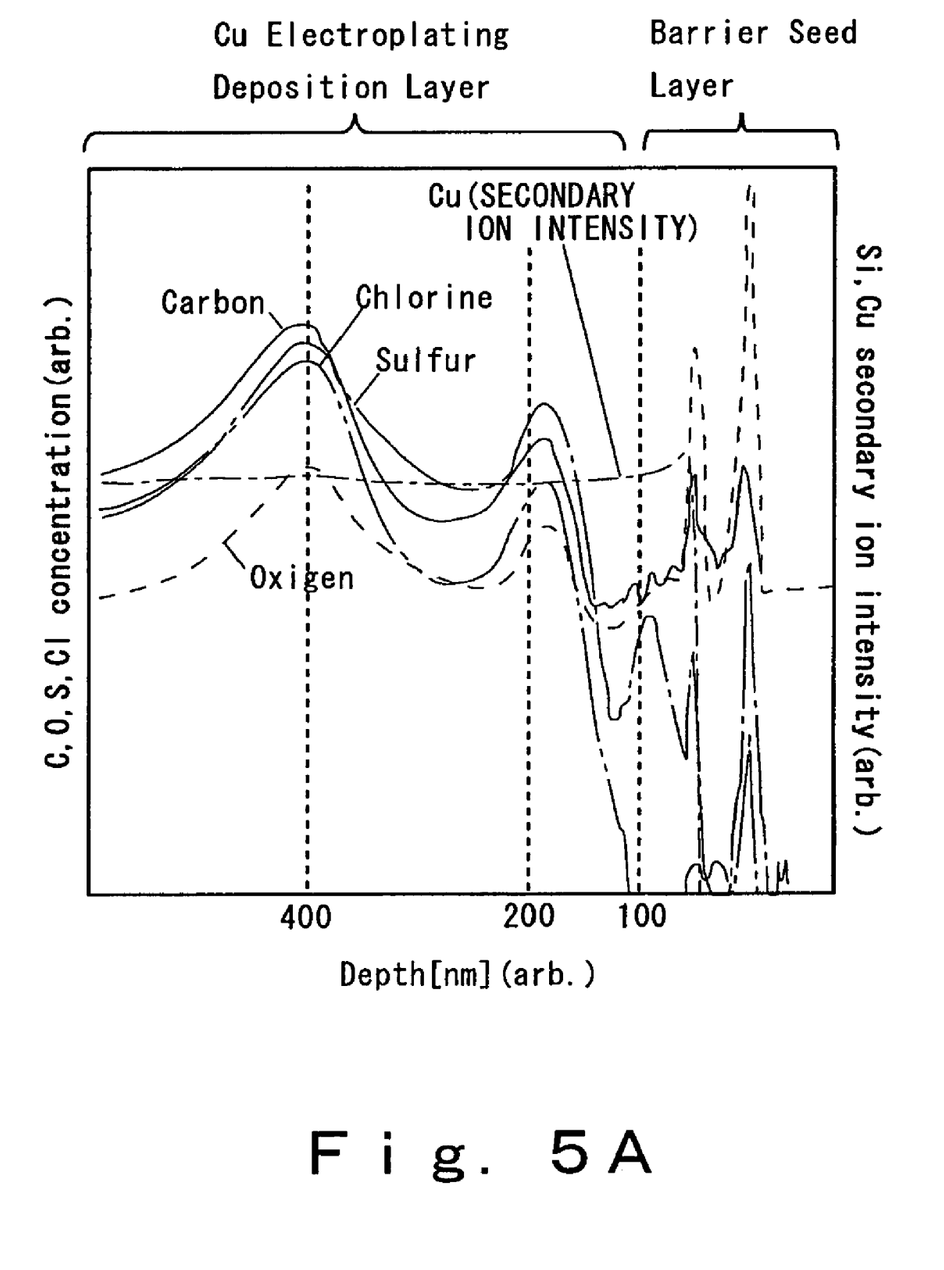
FIG. 5A is a graph illustrating a relationship between a depth of the wiring and concentration of impurities.
Figure 5B:
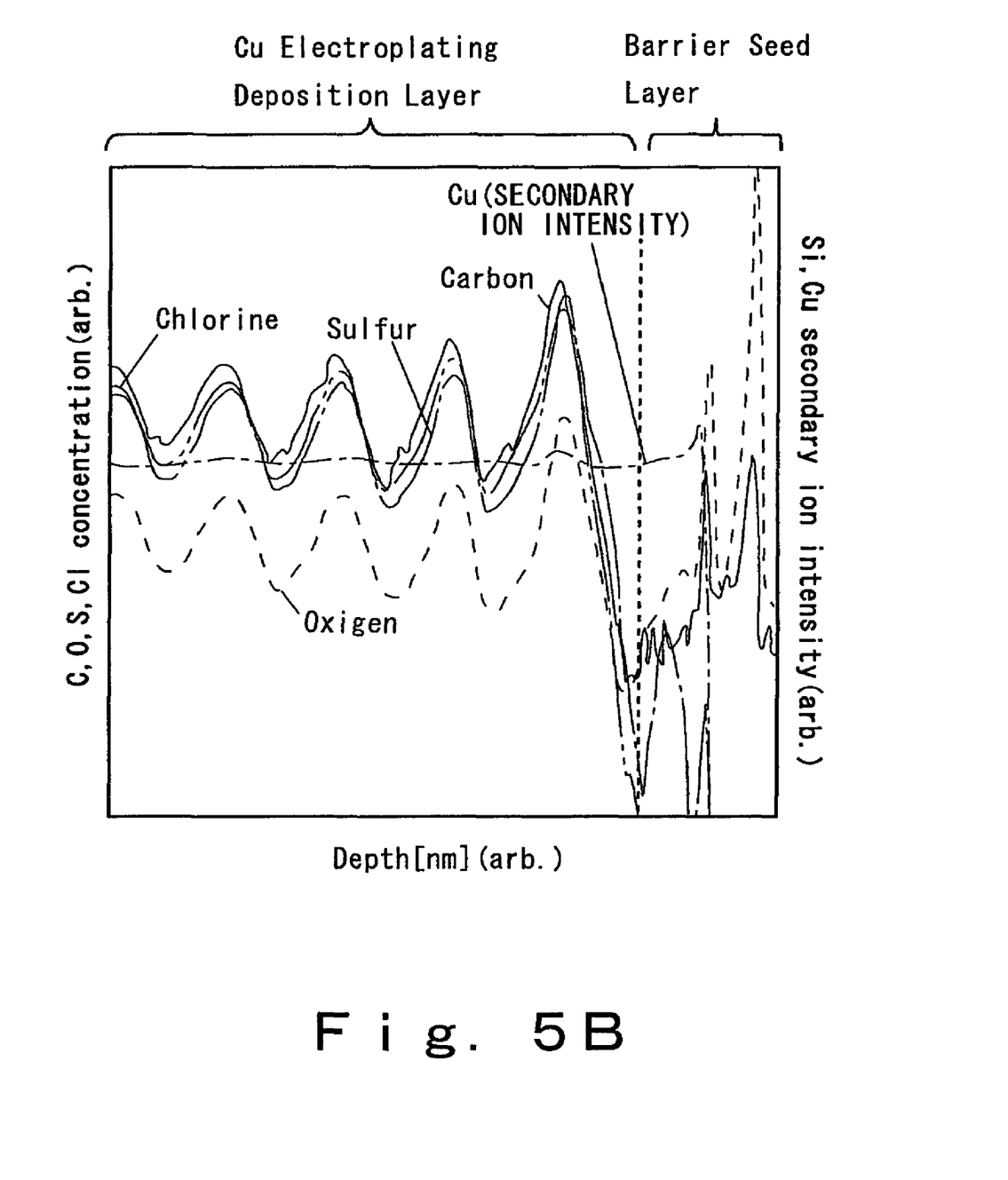
FIG. 5B is a graph illustrating the relationship between the depth of the wiring and the concentration of impurities.

FIGS. 5A and 5B are graphs each illustrating a relationship between a depth of the wiring and concentration of impurities of the semiconductor substrate 7 manufactured by the semiconductor device manufacturing apparatus 1 and the semiconductor manufacturing method according to the embodiment.

FIG. 5A illustrates the impurity concentration of the copper plated film in a case where the film is grown under such an application voltage as to flow the current of 3.3 mA/cm$^2$ in the region in which the thickness of the copper plated film is equal to or larger than 100 nm but less than 200 nm, the film is grown under such an application voltage as to flow the current of 10.1 mA/cm² in the region in which the thickness of the copper plated film is equal to or larger than 200 nm but less than 400 nm, and the film is grown under such an application voltage as to flow the current of 50.5 mA/cm² in the region in which the thickness of the copper plated film is equal to or larger than 400 nm. The current density is tripled in a position that is 200 nm in thickness of the grown film and is quintupled in a position of 400 nm in thickness of the grown film. As understood from this graph, when the current density at the film-grown time is changed triple or quintuple, it proves that a peak of the impurity concentration of the copper plated film rises. It is remarkably recognized that the peak of the impurity concentration is higher particularly when the current density is quintupled than when tripled. Incidentally, it is presumed that the peak intensity of concentration of impurities decreases on the whole if the change of the current density is set less than triple, which is considered to be a value unsuited to the use for the control aiming at adjusting concentration of impurities.

FIG. 5B depicts a distribution of the impurity concentration of the copper plated film grown through the transition conducted five times from the low-current state to the high-current state. It is understood that the concentration of the impurity mixed in the on-growing copper plated film rises due to an increase in transition count between the low-current state and the high-current state.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A semiconductor device manufacturing method comprising:
   forming an inter-layer insulating film over a semiconductor substrate;
   forming a first wiring trench of which a depth-to-width ratio is larger than 1 and a second wiring trench of which the depth-to-width ratio is equal to or smaller than 1 in the inter-layer insulating film;
   forming a seed layer over the inter-layer insulating film, an internal wall of the first wiring trench and an internal wall of the second wiring trench;
   depositing a first copper layer over the seed layer up to a state where the first wiring trench is embedded but the second wiring trench is not completely embedded by use of an electroplating method employing a current having a first current density;
   forming a second copper layer over the first copper layer till the second wiring trench is embedded by use of the electroplating method of the current with a transition of the current density, which is conducted a plural number of times between the first current density and a second current density higher than the first current density; and
   polishing said seed layer, the first copper layer and the second copper layer formed over the inter-layer insulating film.

2. The semiconductor device manufacturing method according to claim 1, wherein the first copper layer and the second copper layer contain at least anyone of sulfur, chlorine, oxygen, carbon and nitrogen as an impurity.

3. The semiconductor device manufacturing method according to claim 1, wherein the second current density is equal to or larger than triple of the first current density.

4. The semiconductor device manufacturing method according to claim 1, wherein the second current density is equal to or larger than quintuple of the first current density.

5. The semiconductor device manufacturing method according to claim 1, wherein the first current density is equal to or smaller than 10 mA/cm², and the second current density is larger than 10 mA/cm².

6. The semiconductor device manufacturing method according to claim 1, wherein a thickness of the first copper layer is equal to or smaller than one-fourth of a thickness of the second copper layer.

7. The semiconductor device manufacturing method according to claim 1, wherein the thickness of the first copper layer is equal to or smaller than one-tenth of the thickness of the second copper layer.

* * * * *